United States Patent [19]
Liu et al.

[11] Patent Number: 5,676,767
[45] Date of Patent: Oct. 14, 1997

[54] CONTINUOUS PROCESS AND REEL-TO-REEL TRANSPORT APPARATUS FOR TRANSVERSE MAGNETIC FIELD ANNEALING OF AMORPHOUS MATERIAL USED IN AN EAS MARKER

[75] Inventors: Nen-Chin Liu, Parkland; Larry Speciale, Deerfield Beach, both of Fla.

[73] Assignee: Sensormatic Electronics Corporation, Deerfield Beach, Fla.

[21] Appl. No.: 420,757

[22] Filed: Apr. 12, 1995

Related U.S. Application Data

[63] Continuation-in-part of Ser. No. 269,651, Jun. 30, 1994, Pat. No. 5,469,140.
[51] Int. Cl.[6] ......................................... H01F 1/14
[52] U.S. Cl. .............................. 148/108; 148/121
[58] Field of Search .................... 148/108, 121

[56] References Cited

U.S. PATENT DOCUMENTS

| | | | |
|---|---|---|---|
| 4,437,907 | 3/1984 | Sato et al. | 148/108 |
| 4,475,962 | 10/1984 | Hayakawa et al. | 148/108 |
| 4,482,402 | 11/1984 | Taub | 148/121 |
| 4,510,489 | 4/1985 | Anderson, III et al. | 340/572 |
| 5,252,144 | 10/1993 | Martis | 148/121 |

FOREIGN PATENT DOCUMENTS

| | | | |
|---|---|---|---|
| 58-37127 | 3/1983 | Japan | 148/108 |
| 59-6360 | 1/1984 | Japan | 148/108 |
| 1731830 | 5/1992 | U.S.S.R. | 148/108 |

*Primary Examiner*—John Sheehan
*Attorney, Agent, or Firm*—Robin, Blecker, Daley & Driscoll

[57] ABSTRACT

A magnetostrictive element for use in a magnetomechanical electronic article surveillance marker is formed by annealing a continuous ribbon of an amorphous metal alloy. The alloy ribbon is transported from reel to reel through an oven in which a transverse saturating magnetic field is applied to the ribbon. The annealed ribbon is cut into discrete strips which are suitable for use as magnetostrictive elements.

10 Claims, 10 Drawing Sheets

CONTINUOUS PROCESS AND REEL-TO-REEL TRANSPORT APPARATUS FOR TRANSVERSE MAGNETIC FIELD ANNEALING OF AMORPHOUS MATERIAL USED IN AN EAS MARKER

CROSS REFERENCE TO RELATED APPLICATION

This application is a continuation-in-part of prior application Ser. No. 08/269,651 filed Jun. 30, 1994 (now U.S. Pat. No. 5,469,140), which prior application has a common inventor and a common assignee with the present application.

FIELD OF THE INVENTION

This invention relates to a method and apparatus for forming active elements to be used in markers for magnetomechanical electronic article surveillance systems and more particularly to such a method and apparatus in which an amorphous metal alloy material is heat-treated in the presence of a magnetic field.

BACKGROUND OF THE INVENTION

U.S. Pat. No. 4,510,489, issued to Anderson et al., discloses a magnetomechanical electronic article surveillance (EAS) system in which markers incorporating a magnetostrictive active element are secured to articles to be protected from theft. The markers are detected by means of an interrogation signal generating device which generates an alternating magnetic field at a predetermined frequency which induces a mechanical resonance in the active element of the marker. The signal resulting from the mechanical resonance is detected by receiving equipment.

The Anderson et. al. patent discloses a number of materials that may be used for the active element, and also describes techniques used for treating the materials. The disclosed techniques include heat-treating (annealing) an amorphous material in a saturating magnetic field. The disclosure of the Anderson et al. patent is incorporated herein by reference.

U.S. Pat. No. 5,252,144, issued to Martis, discloses further materials said to be suitable for use as active elements in magnetomechanical EAS markers as well as annealing processes (without application of a magnetic field) to be applied to the materials. In accordance with conventional practice, the annealing processes disclosed in the Martis patent are applied to batches of pre-cut strips of magnetic material. The conventional sequence of first cutting strips from a continuous ribbon and then annealing the cut strips is necessary because known annealing techniques cause brittleness in the material which prevents satisfactory cutting after annealing has been carried out.

The above-referenced '651 co-pending application ('140 patent) discloses a procedure in which batches of pre-cut strips of a cobalt-rich amorphous metal alloy are annealed in the presence of a saturating transverse magnetic field. The resulting annealed strips are suitable for use as the active elements in magnetomechanical markers and have improved ring-down characteristics which enhance performance in pulsed magnetomechanical EAS systems. In addition, the hysteresis loop characteristic of the resulting active element is such as to eliminate or reduce false alarms that may result from exposure to harmonic EAS systems. Further, the relatively uniform magnetic characteristics resulting from the transverse-field annealing process make it possible to pre-cut the amorphous strips to a pre-determined fixed length, rather than frequently measuring the magnetic characteristics and adjusting the cut-length as is required when using conventional as-cast amorphous materials.

Although the materials and techniques disclosed in the co-pending '651 application provide advantages in terms of performance and convenience of manufacture as compared to conventional materials and techniques, it would be desirable to provide still more convenient manufacturing techniques, particularly in view of difficulties encountered in handling the pre-cut segments of amorphous material.

OBJECTS AND SUMMARY OF THE INVENTION

It is accordingly an object of the invention to provide a method and apparatus for forming active elements for EAS markers from continuous magnetic materials with improved processing efficiency.

According to an aspect of the invention, a method of forming a magnetostrictive element for use in a magnetomechanical electronic article surveillance marker includes the steps of providing a continuous strip of an amorphous metal alloy, transporting the continuous amorphous alloy strip through an annealing region in which heat and a saturating magnetic field are applied to anneal the strip, and cutting the annealed continuous strip into discrete strips each having a predetermined length. Preferably, the continuous alloy strip is in the form of a flat continuous ribbon.

According to further aspects of the invention, the continuous amorphous alloy ribbon is fed from a supply reel located on one side of the annealing region and taken up on a take-up reel located on an opposite side of the annealing region from the supply reel. In a further practice in accordance with the invention, a curved shape is imparted to the ribbon during the transportation of the ribbon through the annealing region by transporting the ribbon through a curling fixture which forms a curvature in the ribbon in a direction transverse to the longitudinal axis of the ribbon. As another alternative, a substantially flat profile is imparted to the ribbon during the transportation of the ribbon through the annealing region by transporting the ribbon through a fixture which has a flat guide surface.

According to another aspect of the invention, there is provided an apparatus for annealing a continuous strip of an amorphous metal alloy, which includes an oven, magnetic field means for forming a magnetic field in the oven, and transport means for transporting the continuous strip along a path through the oven.

According to further aspects of the invention, the transport means includes a supply reel and a pick-up reel on opposite sides of the oven with the continuous amorphous alloy strip being unwound from the supply reel and wound up on the take-up reel. Also, the transport means includes a capstan and a pinch roller, both interposed between the oven and the take-up reel, with the strip being engaged between the capstan and pinch roller and being driven by the capstan in a direction from the supply reel to the take-up reel.

DESCRIPTION OF PREFERRED EMBODIMENTS

Figure 1:
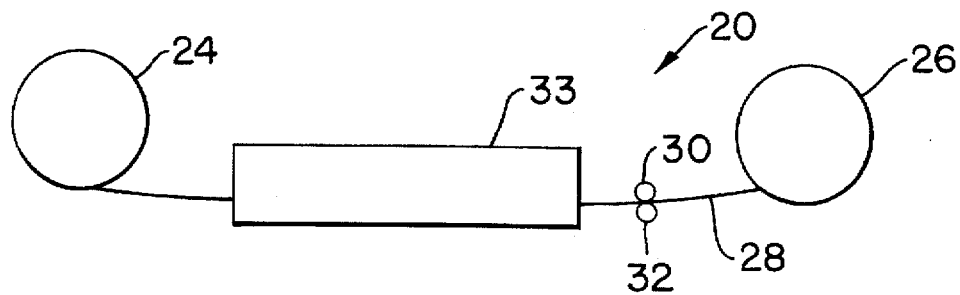
FIG. 1 is a side view of a processing apparatus provided in accordance with the invention.
Figure 2:
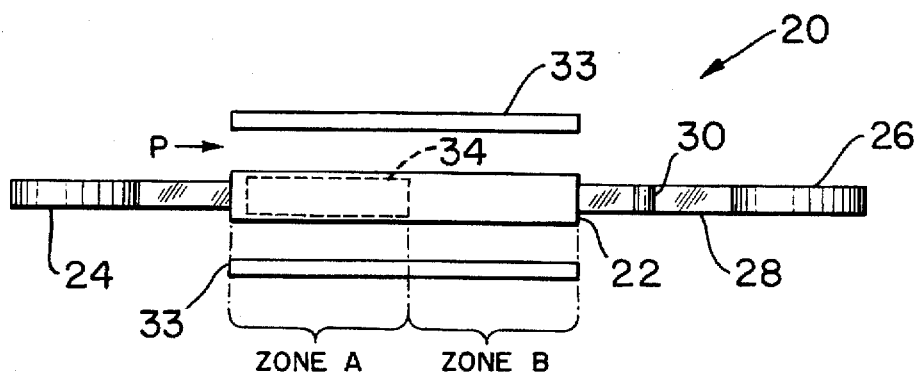
FIG. 2 is a top view of the processing apparatus of FIG. 1.

There will now be described, with initial reference to FIGS. 1 and 2, a method and processing apparatus provided in accordance with the invention for forming the active elements of magnetomechanical EAS markers from a continuous ribbon of amorphous metal alloy. It is to be noted that FIG. 1 is a side view of the apparatus and FIG. 2 is a top view of the apparatus.

Reference numeral 20 generally indicates the processing apparatus. The processing apparatus includes an oven 22, and supply and take-up reels 24, 26 provided at opposite sides of the oven 22. A continuous ribbon 28 of amorphous metal is unwound from the supply reel 24 and transported along a path P through the oven 22 and then is taken up on the take-up reel 26. The ribbon 28 is engaged between a capstan 30 and a pinch roller 32 positioned between the oven 22 and the take-up reel 26. The capstan 30, in cooperation with the pinch roller 32, draws the ribbon 28 along its path P through the oven 22.

Arrays 33 of permanent magnets are provided alongside the oven 22 so as to generate a magnetic field, within the oven 22, that is transverse to the longitudinal axis of the ribbon 28. The field should be strong enough to be saturating for the material making up the ribbon 28. Depending on the material used, the optimum field may be in excess of 500 Oe, and a field as strong as 800 Oe may be necessary to achieve saturation.

The oven 22 may be of a conventional type, and includes two zones (Zone A and Zone B in FIG. 2) in which different temperatures are maintained. As will be seen, a higher temperature is maintained in Zone A than in Zone B. The distance of travel in the two zones along the path of travel of the ribbon 28 is substantially the same. Since the ribbon 28 is moved at a constant speed by the capstan 30, each point of the ribbon 28 spends a substantially equal amount of time in Zone A and Zone B. In a preferred embodiment, the entire length of the path of travel through the oven 22 is about 2 meters so that the distance of travel through each of Zones A and B is about 1 meter. It is seen from FIG. 2 that Zone A is upstream from Zone B relative to the path of travel of the ribbon 28.

The temperature maintained in Zone A of the oven 22 will be referred to as T1 and the temperature maintained in Zone B will be referred to as T2. The time required for an arbitrary point on the ribbon 28 to pass through Zone A will be referred to as t1 and the time required for that point to pass through Zone B will be referred to as t2. The temperature experienced by each point on the ribbon as the ribbon is transported through the oven 22 is graphically illustrated in FIG. 4. It will be observed that each point is exposed to a temperature T1 for a time period t1 and then is exposed to a temperature T2 for a time period t2 which is substantially the same in duration as t1.

Alternatively, the same temperature may be maintained in both Zone A and Zone B (i.e., T1=T2), in which case it will be recognized that a substantially uniform temperature is maintained throughout the oven 22.

Figure 3:
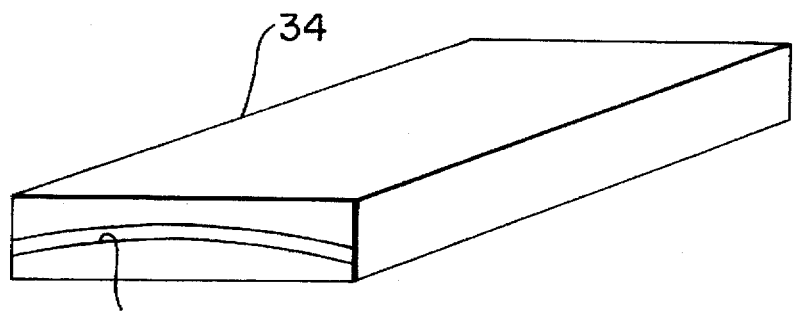
FIG. 3 is a perspective view of a curling fixture employed in the processing apparatus of FIGS. 1 and 2.

A curling fixture 34 is optionally provided within the oven 22 for the purpose of imparting a transverse curl to the ribbon 28. As best seen in FIG. 3, the fixture 34 has a curl surface 36 which, proceeding in a direction transverse to the longitudinal axis of the ribbon 28, rises and then falls. The fixture 34, if present, is placed in Zone A of the oven 22 and the ribbon 28 is drawn longitudinally through the fixture 34. The heating applied to the ribbon 28 during its passage through the fixture 34 causes the ribbon 28 to conform itself to the curl surface 36, thereby imparting a transverse curve to the ribbon 28. The result of the treatment is that cut strips subsequently produced from the ribbon 28 have a curve transverse to the longitudinal axis of the strips, in correspondence to the curl surface 36. The transversely-curved active elements are provided to reduce or avoid a clamping effect that might otherwise occur when the active element is mounted in the EAS marker in proximity to a magnetic biasing element.

As indicated in FIG. 2, the fixture 34 is preferably about as long as the Zone A, which is about 1 meter long according to example mentioned above. The fixture 34 is, of course, wide enough to accommodate the ribbon 28, and the curl surface 36 is contoured so as to impart to the ribbon 28 a curve which has a height at its crown that is about 0.0127 cm to 0.0254 cm above the transverse edges of the ribbon 28.

Figure 3A:
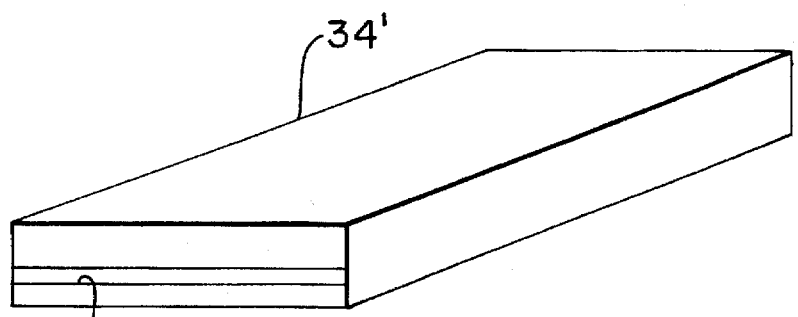
FIG. 3A is a perspective view of a fixture that may alternatively be employed in the processing apparatus so as to impart a flat cross-sectional profile to a metal ribbon processed in the processing apparatus.

As an alternative to the fixture 34 shown in FIG. 3, there can be provided a fixture 34' (shown in FIG. 3A) with a flat guide surface 37 instead of a curved surface in order to produce active elements that are substantially flat sections cut from the ribbon 28. As indicated in the above-referenced '651 application, annealing the material on a flat surface tends to eliminate longitudinal curling in the active element and makes it possible to reduce the overall height of the EAS marker.

Reel motors (not shown) are respectively provided for the supply reel 24 and the take-up reel 26. The take-up reel motor is operated so that the ribbon 28 is taken up, upon emerging from the capstan 30 and pinch rollers 32, with little or no slack and only a modest amount of tension, and the motor for the supply reel 24 is also operated so as to minimize both slack and tension in the ribbon 28 while it passes through the oven 22. The speed of operation of the reel motors may be controlled by a human operator, or an automatic control system may be provided.

Upon completion of the continuous transverse-field annealing process illustrated in FIGS. 1 and 2, the annealed continuous ribbon is cut into strips according to a conventional technique. However, the magnetic properties imparted by continuous annealing in accordance with the invention are sufficiently uniform that the magnetic properties of the material only need to be measured, and the cut-length of the strips accordingly adjusted, at intervals on the order of a thousand strips, rather than for every strip, as is required when cutting as-cast amorphous ribbon.

Particular examples of the application of the inventive process will now be described.

EXAMPLE 1

Figure 5:
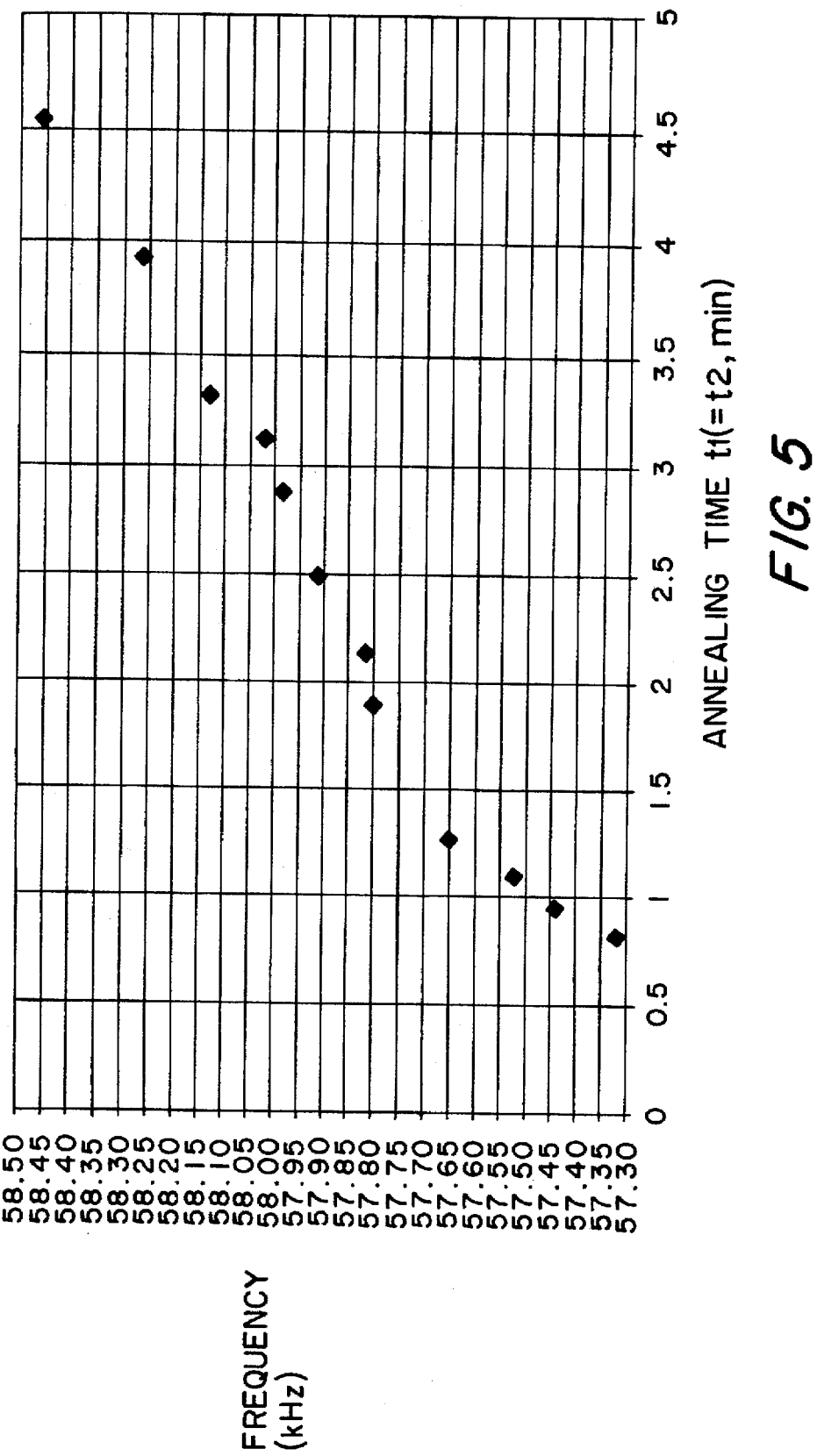
FIG. 5 is a graphical representation of variations in resonant frequency resulting from changes in annealing time in a first example of the inventive process.
Figure 6:
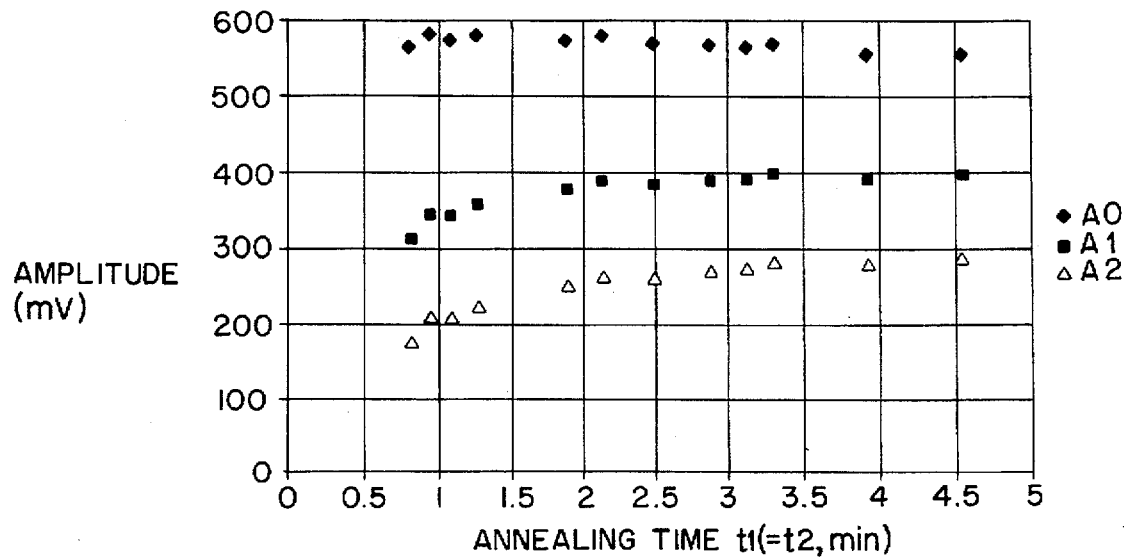
FIG. 6 is a graphical representation of variations in output signal amplitude resulting from changes in annealing time in the first example of the inventive process.

An amorphous ribbon of a material sold by Allied Corporation under the designation "Metglas 2726A" (which is an iron-cobalt-silicon-boron alloy) was transverse-field annealed according to the technique described above. The ribbon had a width of about 12.7 mm and a thickness of about 0.0254 mm. After annealing, the ribbon was cut into strips having a fixed length of 39.4 mm. The influence of annealing time on resonant frequency and signal output is illustrated in the following Table 1 and in FIGS. 5 and 6.

TABLE 1

| | Annealing Conditions | | | | Magnetic Properties (at 6.6 Oe) | | | |
|---|---|---|---|---|---|---|---|---|
| | T1 (°C.) | t1 (min) | T2 (°C.) | t2 (min) | A0 (mV) | A1 (mV) | A2 (mV) | Fr (kHz) |
| 1 | 350 | 4.54 | 200 | 4.54 | 556 | 397 | 289 | 58.459 |
| 2 | 350 | 3.93 | 200 | 3.93 | 556 | 392 | 281 | 58.262 |
| 3 | 350 | 3.31 | 200 | 3.31 | 568 | 398 | 283 | 58.127 |
| 4 | 350 | 3.13 | 200 | 3.13 | 565 | 392 | 275 | 58.017 |
| 5 | 350 | 2.88 | 200 | 2.88 | 567 | 390 | 270 | 57.987 |
| 6 | 350 | 2.49 | 200 | 2.49 | 569 | 384 | 262 | 57.913 |
| 7 | 350 | 2.14 | 200 | 2.14 | 580 | 389 | 264 | 57.817 |
| 8 | 350 | 1.89 | 200 | 1.89 | 574 | 378 | 253 | 57.799 |
| 9 | 350 | 1.27 | 200 | 1.27 | 582 | 359 | 226 | 57.649 |
| 10 | 350 | 1.09 | 200 | 1.09 | 575 | 343 | 209 | 57.522 |
| 11 | 350 | 0.95 | 200 | 0.95 | 584 | 346 | 210 | 57.442 |
| 12 | 350 | 0.82 | 200 | 0.82 | 565 | 313 | 178 | 57.320 |

Figure 4:
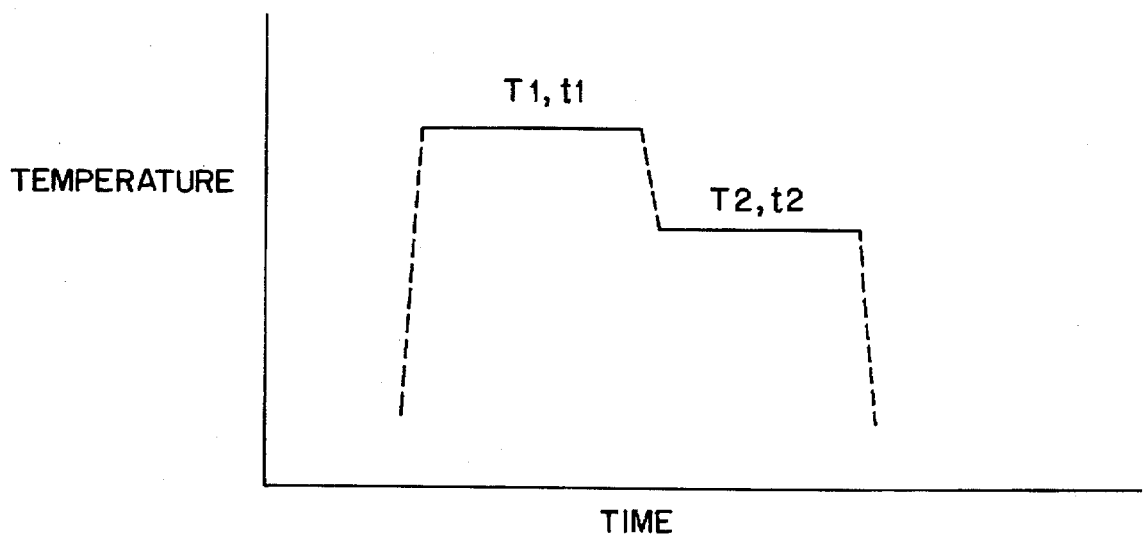
FIG. 4 is a graphical representation of variations over time in the temperature applied to an amorphous metal ribbon as the ribbon is transported through the processing apparatus of FIGS. 1 and 2.

In this example, the temperature in Zone A was maintained at 350° C. and in Zone B at 200° C. The time spent by an arbitrary point on the ribbon 28 in each of these zones ranged from 0.82 minute up to 4.54 minutes. The operating characteristics of the resulting strips were measured in a longitudinal bias field of 6.6 Oe. The values A0, A1, and A2 listed in Table 1 are, respectively, the output signal amplitude exhibited immediately at the end of an interrogation pulse, and 1 and 2 milliseconds after the pulse. As indicated in FIGS. 3 and 4, the resonant frequency of the material is subject to some variation depending on the annealing time. For example, the resonant frequency decreases in a substantially linear fashion as the annealing time decreases and at a rate of about 250 Hz per minute of annealing time. Within this range of annealing times, the output signal amplitude is high and does not vary a great deal.

EXAMPLE 2

Figure 7:
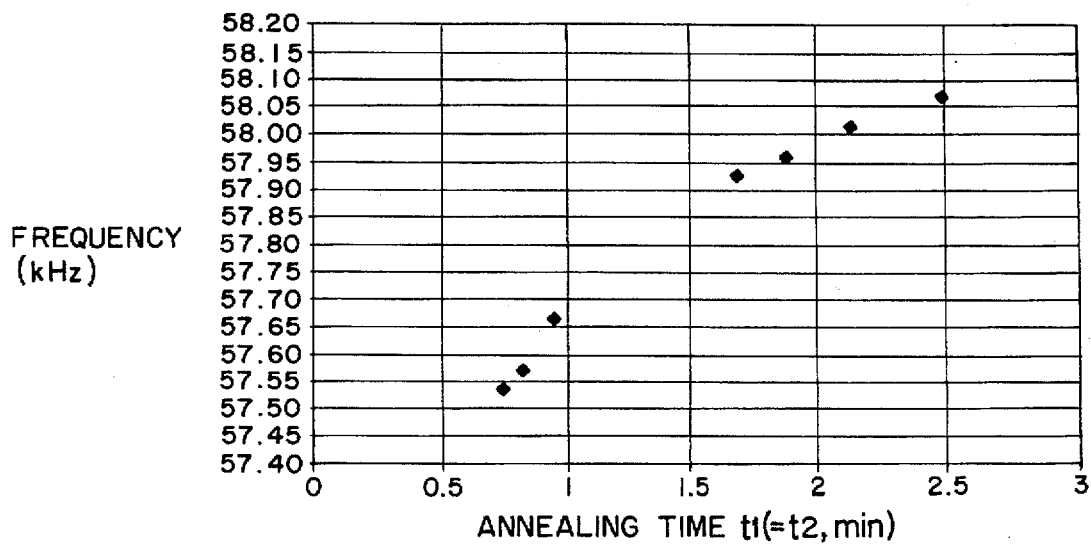
FIG. 7 is a graphical representation of variations in resonant frequency resulting from changes in annealing time in a second example of the inventive process.
Figure 8:
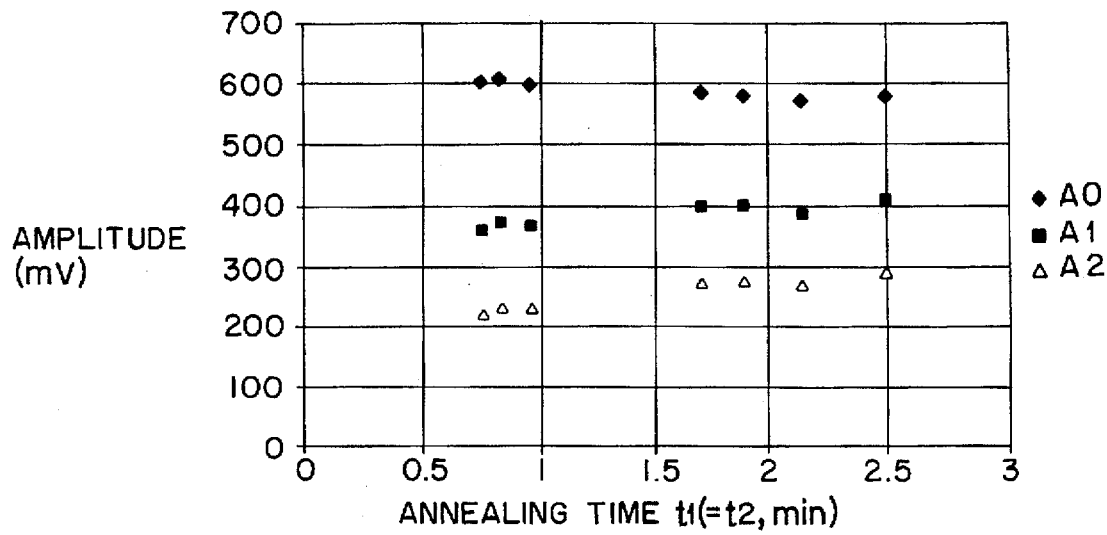
FIG. 8 is a graphical representation of variations in output signal amplitude resulting from changes in annealing time in the second example of the inventive process.

The same ribbon material was processed in the same manner as in Example 1 except that a slightly higher temperature (360° C.) was maintained in Zone A and the annealing time ranged from 0.74 minute to 2.49 minutes in each zone. The results are shown in the following Table 2 and in FIGS. 7 and 8. Again, there is a substantially linear decrease in resonant frequency as annealing time is reduced.

TABLE 2

| | Annealing Conditions | | | | Magnetic Properties (at 6.6 Oe) | | | |
|---|---|---|---|---|---|---|---|---|
| | T1 (°C.) | t1 (min) | T2 (°C.) | t2 (min) | A0 (mV) | A1 (mV) | A2 (mV) | Fr (kHz) |
| 1 | 360 | 2.49 | 200 | 2.49 | 579 | 409 | 293 | 58.064 |
| 2 | 360 | 2.14 | 200 | 2.14 | 572 | 391 | 271 | 58.009 |
| 3 | 360 | 1.89 | 200 | 1.89 | 581 | 399 | 277 | 57.956 |
| 4 | 360 | 1.70 | 200 | 1.70 | 585 | 399 | 274 | 57.923 |
| 5 | 360 | 0.95 | 200 | 0.95 | 598 | 369 | 233 | 57.657 |
| 6 | 360 | 0.82 | 200 | 0.82 | 607 | 375 | 234 | 57.565 |
| 7 | 360 | 0.74 | 200 | 0.74 | 602 | 362 | 222 | 57.533 |

EXAMPLE 3

Figure 9:
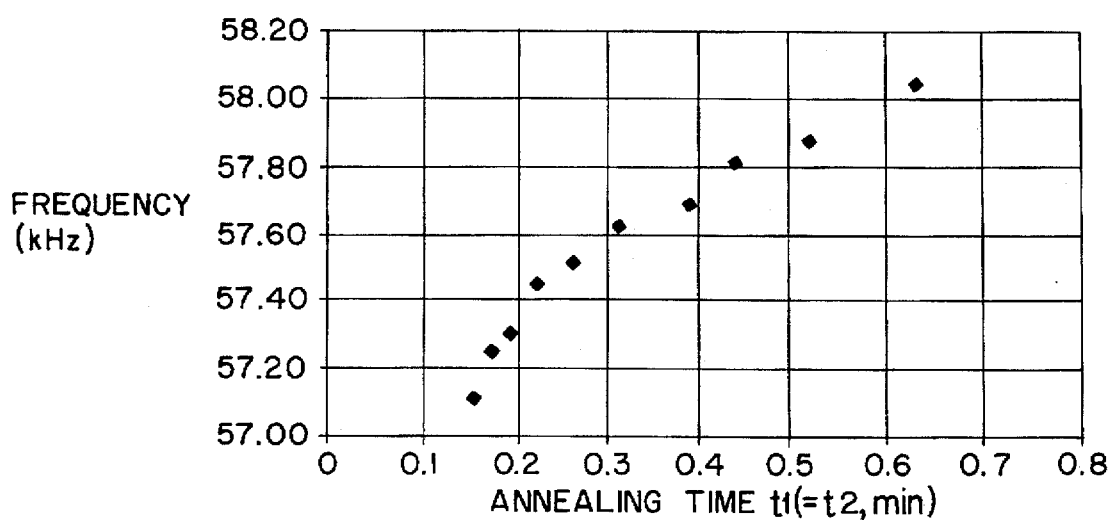
FIG. 9 is a graphical representation of variations in resonant frequency resulting from changes in annealing time in a third example of the inventive process.
Figure 10:
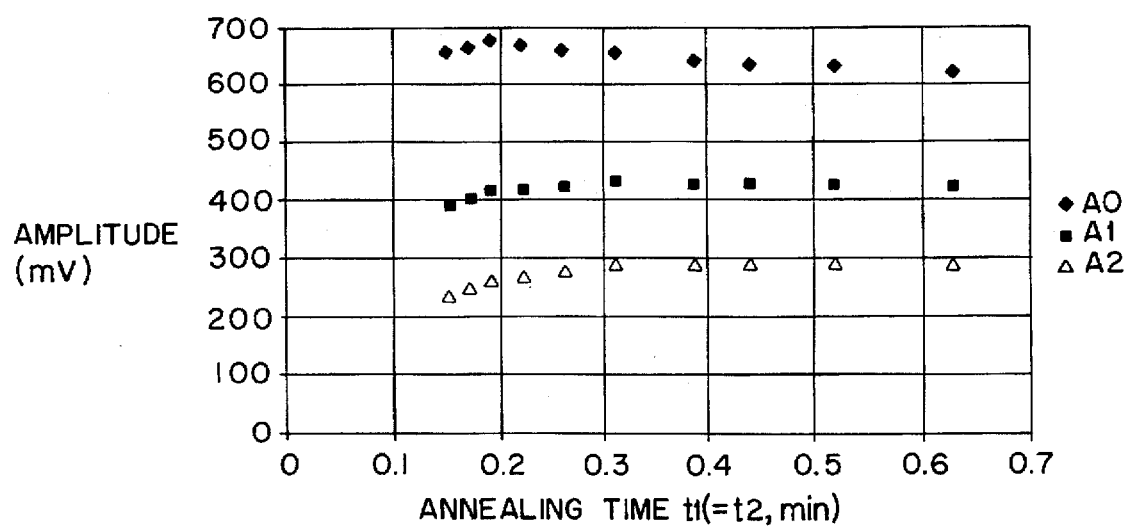
FIG. 10 is a graphical representation of variations in output signal amplitude resulting from changes in annealing time in the third example of the inventive process.

The same process was performed again with the same material, except that the temperature in Zone A was maintained at 380° C. and the temperature in Zone B at 250° C., with the annealing time in each zone ranging from 0.15 minute to 0.63 minute. Again, a dependence of resonant frequency on annealing time is noted. With the higher annealing temperature provided in Example 3, satisfactory signal output levels can be obtained with a total annealing time (total of t1 and t2) as low as about 20 seconds. The results are shown in Table 3 below and in FIGS. 9 and 10.

TABLE 3

| | Annealing Conditions | | | | Magnetic Properties (at 6.6 Oe) | | | |
|---|---|---|---|---|---|---|---|---|
| | T1 (°C.) | t1 (min) | T2 (°C.) | t2 (min) | A0 (mV) | A1 (mV) | A2 (mV) | Fr (kHz) |
| 1 | 380 | 0.63 | 250 | 0.63 | 624 | 424 | 292 | 58.048 |
| 2 | 380 | 0.52 | 250 | 0.52 | 629 | 425 | 290 | 57.875 |
| 3 | 380 | 0.44 | 250 | 0.44 | 635 | 426 | 290 | 57.807 |
| 4 | 380 | 0.39 | 250 | 0.39 | 641 | 425 | 285 | 57.687 |
| 5 | 380 | 0.31 | 250 | 0.31 | 655 | 431 | 288 | 57.621 |
| 6 | 380 | 0.26 | 250 | 0.26 | 657 | 423 | 275 | 57.511 |
| 7 | 380 | 0.22 | 250 | 0.22 | 666 | 419 | 266 | 57.477 |
| 8 | 380 | 0.19 | 250 | 0.19 | 673 | 416 | 261 | 57.303 |
| 9 | 380 | 0.17 | 250 | 0.17 | 662 | 403 | 249 | 57.251 |
| 10 | 380 | 0.15 | 250 | 0.15 | 655 | 389 | 234 | 57.108 |

EXAMPLE 4

Figure 11:
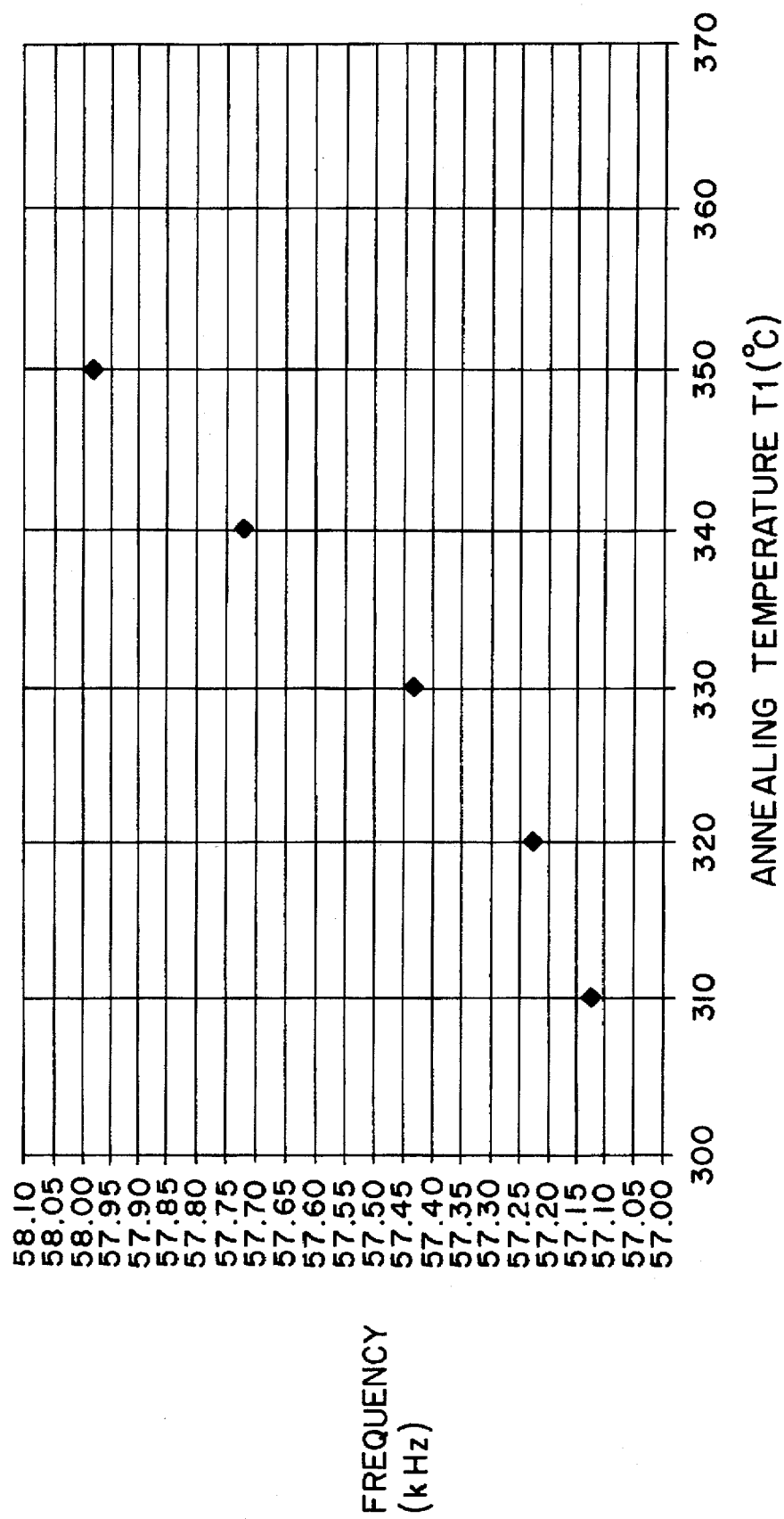
FIG. 11 is a graphical representation of variations in resonant frequency resulting from changes in annealing temperature in a fourth example of the inventive process.
Figure 12:
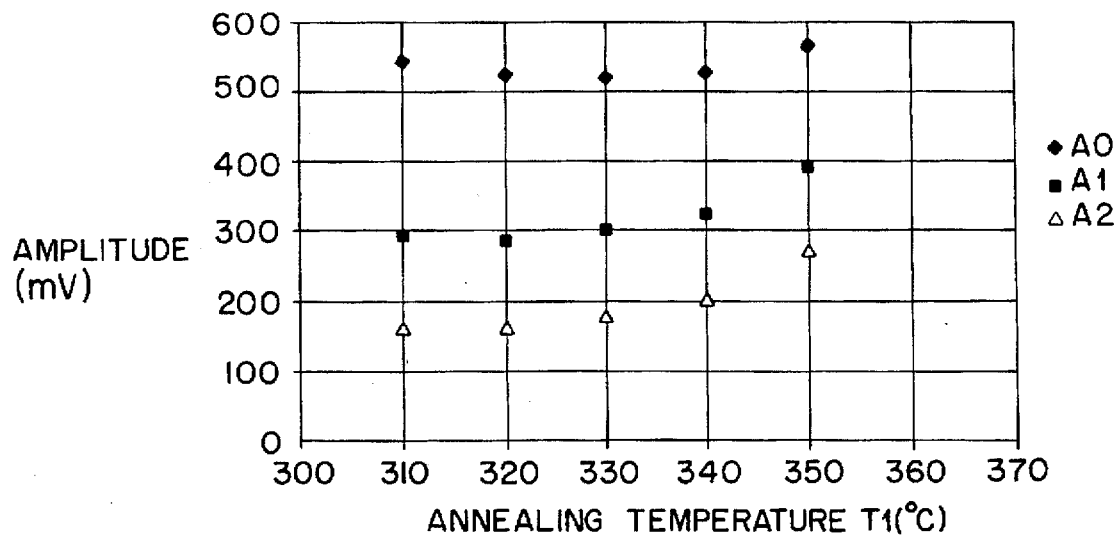
FIG. 12 is a graphical representation of variations in output signal amplitude resulting from changes in annealing temperature in the fourth example of the inventive process.

The same material was processed in the same manner as in the previous examples, except that the annealing time was held at 2.88 minutes in each of Zones A and B and the temperature was varied within a range from 310° C. to 350° C. in Zone A. The temperature in Zone B was fixed at 200° C. The results are indicated in Table 4 below and FIGS. 11 and 12. It will be seen that the resonant frequency decreases as the annealing temperature decreases at a rate of about 22 Hz per degree Centigrade. In general, the level of the signal output also decreased as the annealing temperature was decreased in the above-mentioned range.

TABLE 4

| | Annealing Conditions | | | | Magnetic Properties (at 6.6 Oe) | | | |
|---|---|---|---|---|---|---|---|---|
| | T1 (°C.) | t1 (min) | T2 (°C.) | t2 (min) | A0 (mV) | A1 (mV) | A2 (mV) | Fr (kHz) |
| 1 | 350 | 2.88 | 200 | 2.88 | 567 | 390 | 270 | 57.987 |
| 2 | 340 | 2.88 | 200 | 2.88 | 528 | 325 | 203 | 57.719 |
| 3 | 330 | 2.88 | 200 | 2.88 | 522 | 302 | 179 | 57.438 |
| 4 | 320 | 2.88 | 200 | 2.88 | 527 | 286 | 160 | 57.233 |
| 5 | 310 | 2.88 | 200 | 2.88 | 546 | 292 | 161 | 57.125 |

EXAMPLE 5

Figure 13:
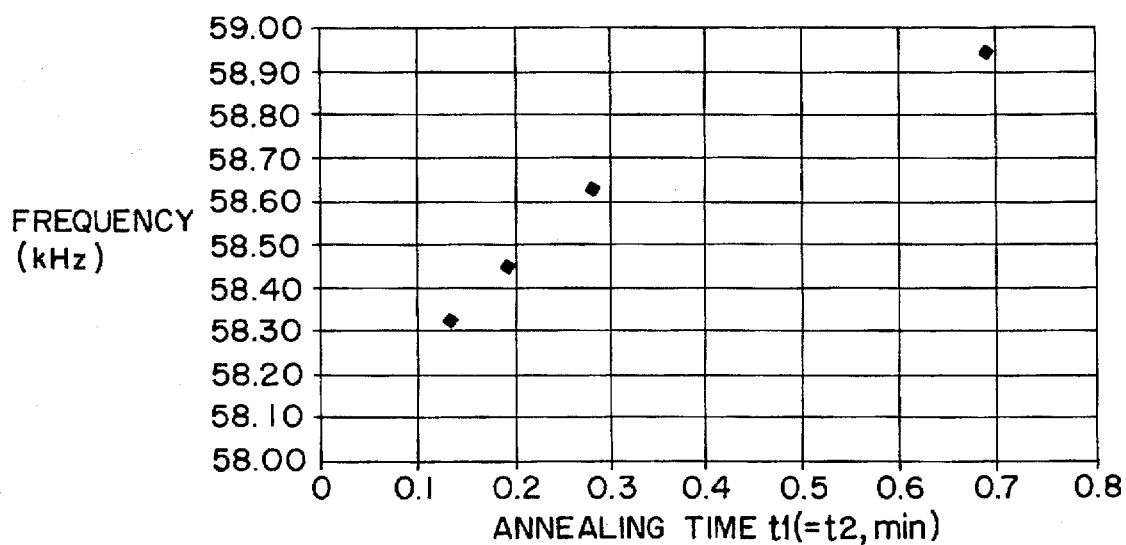
FIG. 13 is a graphical representation of variations in resonant frequency resulting from changes in annealing time in a fifth example of the inventive process.
Figure 14:
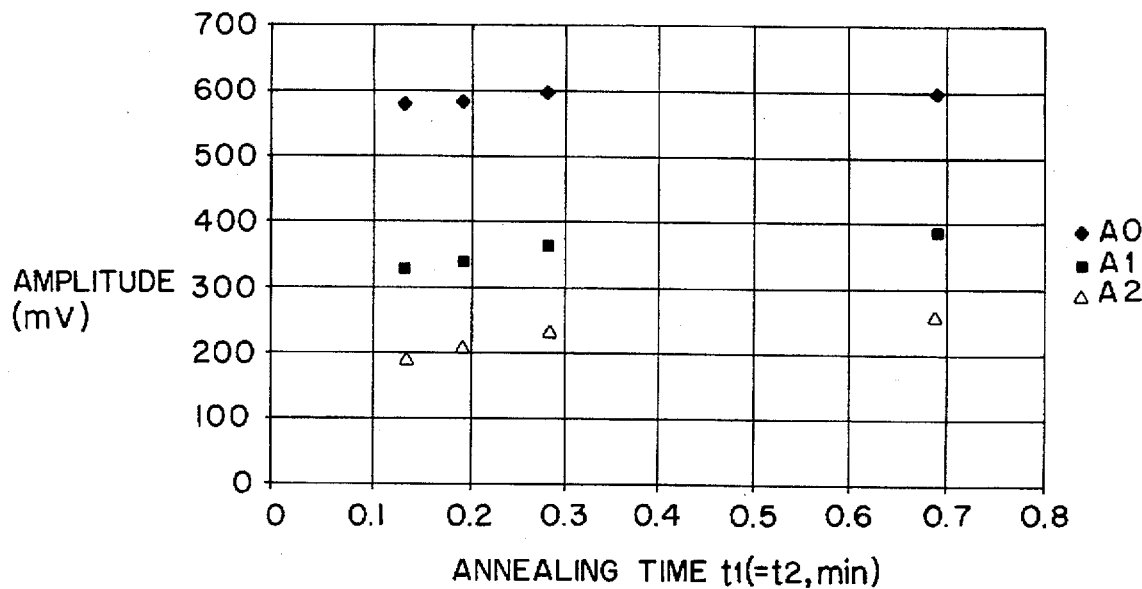
FIG. 14 is a graphical representation of variations in output signal amplitude resulting from changes in annealing time in the fifth example of the inventive process.

The continuous annealing process described in connection with FIGS. 1 and 2 was also applied to an amorphous metal ribbon having the composition $(Fe_{0.5}Co_{0.5})_{79}Si_6B_{15}$ (by atomic percent). The ribbon used in this example had the same dimensions (12.7 mm wide and 0.0254 mm thick) as the ribbon used in Examples 1–4, but was cut into strips 40 mm long after annealing. Signal output levels and resonant frequency of the cut strips was measured in the presence of a longitudinal bias field of 4.2 Oe. In some cases, the temperature in Zone A during annealing was 380° C., with the time in each of the zones at 0.19 or 0.13 minute. In other cases, the temperature in Zone A was 400° C. with the time in each zone ranging from 0.13 minute to 0.69 minute. In all of these cases, the temperature in Zone B was maintained at 250° C. The results obtained in this example are illustrated in Table 5 below and in FIGS. 13 and 14. Again, it was found that the resonant frequency generally decreased as the annealing time was decreased. Also, the high annealing temperature generally resulted in high output signal levels.

TABLE 5

| | Annealing Conditions | | | | Magnetic Properties (at 4.2 Oe) | | | |
|---|---|---|---|---|---|---|---|---|
| | T1 (°C.) | t1 (min) | T2 (°C.) | t2 (min) | A0 (mV) | A1 (mV) | A2 (mV) | Fr (kHz) |
| 1 | 380 | 0.19 | 250 | 0.19 | 473 | 230 | 121 | 57.958 |
| 2 | 380 | 0.13 | 250 | 0.13 | 449 | 195 | 96 | 57.657 |
| 3 | 400 | 0.69 | 250 | 0.69 | 594 | 387 | 260 | 58.943 |
| 4 | 400 | 0.28 | 250 | 0.28 | 595 | 364 | 233 | 58.626 |
| 5 | 400 | 0.19 | 250 | 0.19 | 582 | 338 | 206 | 58.448 |
| 6 | 400 | 0.13 | 250 | 0.13 | 577 | 327 | 195 | 58.321 |

Comparison of Materials Produced in Examples 3 and 5

Figure 15:
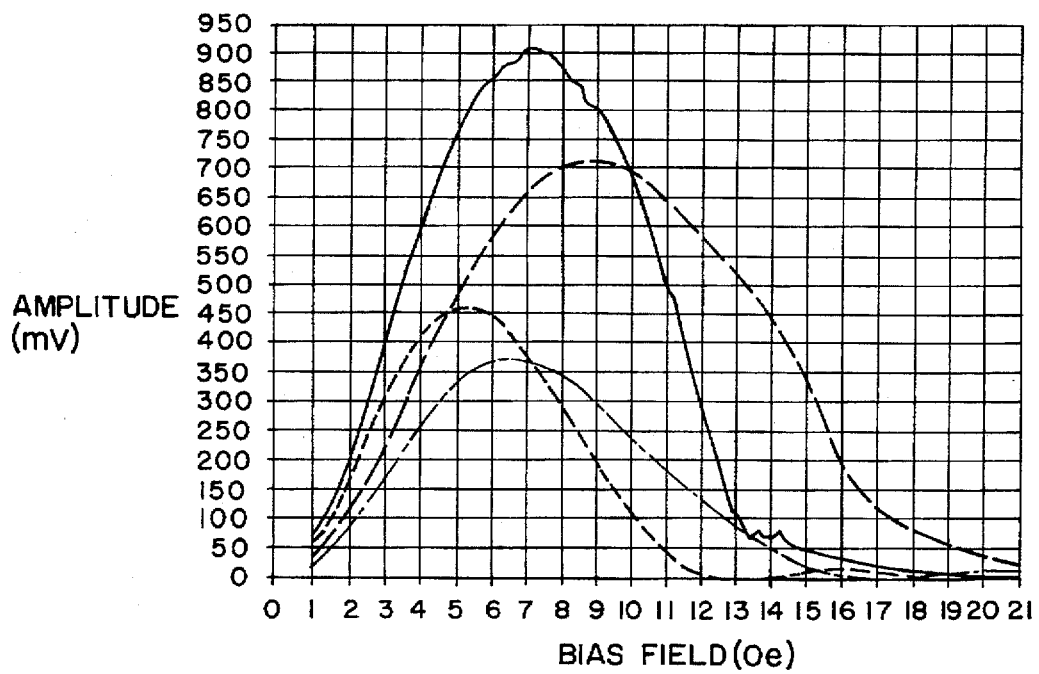
FIG. 15 is a graphical representation showing comparisons of output signal amplitudes and optimum bias field levels for materials respectively produced in the third and fifth examples of the inventive process.

FIG. 15 shows the A0 and A1 output levels, as a function of applied longitudinal biased field, for the eighth sample produced in accordance with Example 3 (eighth line of Table 3) and the fifth sample produced in accordance with Example 5 (fifth line of Table 5). In particular, the solid curve in FIG. 15 is the A0 output for the Example 5 sample, the dotted line is the A1 output for the Example 5 sample, the dashed line is the A0 output for the Example 3 sample, and the dot-dash line is the A1 output for the Example 3 sample. It will be noted that the optimum bias field for the material produced according to Example 5 is substantially lower than the optimum bias field for the material produced according to Example 3. As a result, markers using the material of Example 5 can be assembled with a bias element formed of a less expensive material, and a smaller quantity of such material, than is required for bias elements in conventional magnetomechanical markers. This results in cost savings with respect to the bias element.

It should be noted that the various annealing times described in the above examples can be obtained by varying the constant speed at which the capstan 30 draws the ribbon 28 through the oven 22. For example, the transport speed imparted to the ribbon 28 by the capstan 30 may vary from a maximum of about 11.7 cm per second for the shorter annealing times described above, to about 0.33 cm per second for the longest annealing time.

Continuous annealing of the ribbon material described herein, according to the parameters set out in the above examples, results in a processed ribbon that is ductile enough to permit mechanical cutting after the heat treatment. The cut strips are suitable for use as active elements in magnetomechanical EAS markers. Thus, the disclosed continuous annealing process can be used elements with greater magnetomechanical active elements with greater convenience and at a smaller labor cost than conventional annealing processes.

Figure 16:
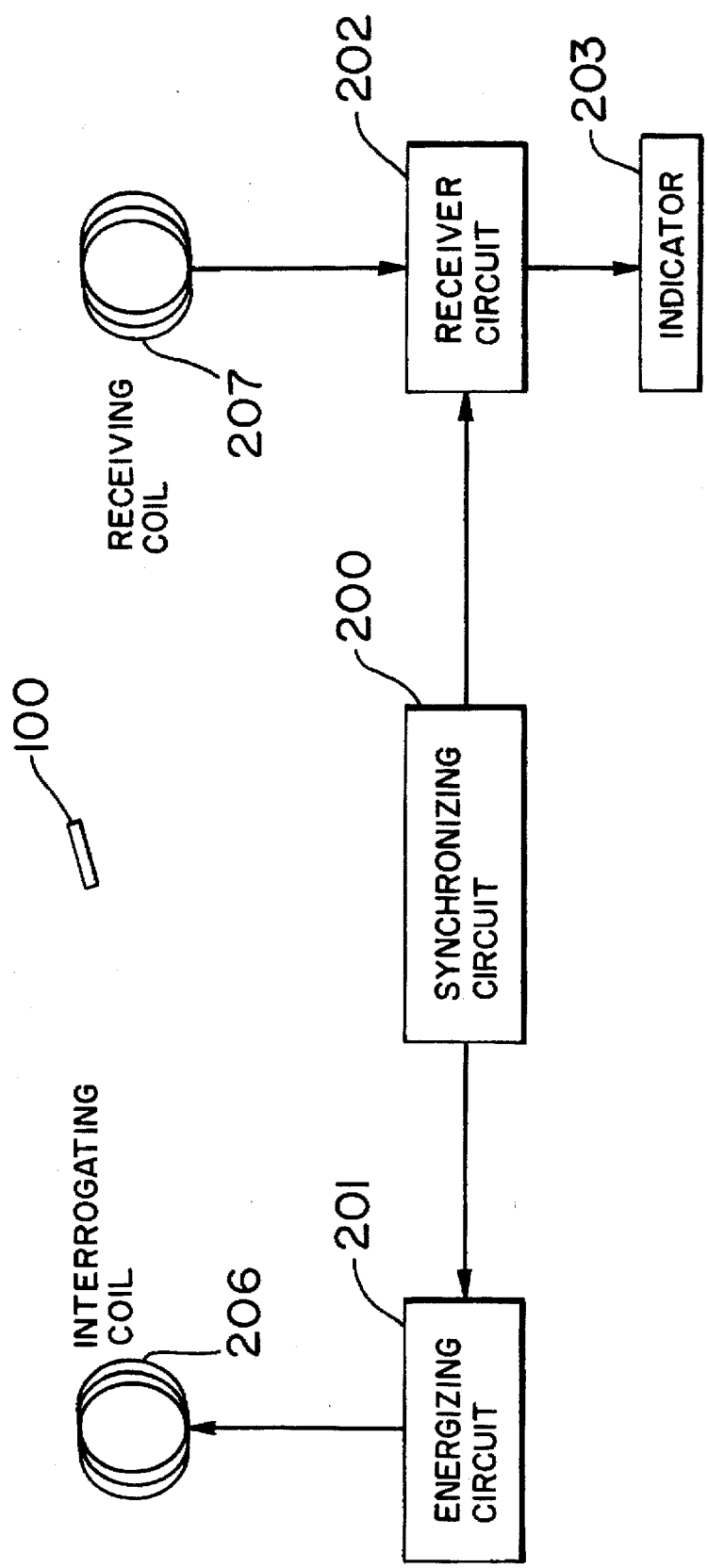
FIG. 16 is a schematic block diagram of an electronic article surveillance system which uses a magnetomechanical marker incorporating an active element formed in accordance with the invention.

FIG. 16 illustrates a pulsed-interrogation EAS system which uses a magnetomechanical marker 100 that incorporates an active element produced in accordance with the invention. The system shown in FIG. 16 includes a synchronizing circuit 200 which controls the operation of an energizing circuit 201 and a receiving circuit 202. The synchronizing circuit 200 sends a synchronizing gate pulse to the energizing circuit 201, and the synchronizing gate pulse activates the energizing circuit 201. Upon being activated, the energizing circuit 201 generates and sends an interrogation signal to interrogating coil 206 for the duration of the synchronizing pulse. In response to the interrogation signal, the interrogating coil 206 generates an interrogating magnetic field, which, in turn, excites the marker 100 into mechanical resonance.

Upon completion of the interrogation signal pulse, the synchronizing circuit 200 sends a gate pulse to the receiver circuit 202, and the latter gate pulse activates the circuit 202. During the period that the circuit 202 is activated, and if a marker is present in the interrogating magnetic field, such marker will generate in the receiver coil 207 a signal at the frequency of the mechanical resonance of the marker. This signal is sensed by the receiver 202, which responds to the sensed signal by generating a signal to an indicator 203 to generate an alarm or the like. In short, the receiver circuit 202 is synchronized with the energizing circuit 201 so that the receiver circuit 202 is only active during quiet periods between the pulses of the pulsed interrogation field.

The materials to which the inventive process and apparatus are applied are preferably in the form of a flat continuous ribbon, as has been indicated in the examples given above. However, it is also contemplated to apply the inventive processes and apparatus to annealing continuous wire transported reel-to-reel, for example. Accordingly, in the appended claims the term "continuous strip" is to be understood as including a continuous wire (having a substantially round cross-section, for example) as well as a continuous ribbon. It is further within the contemplation of the invention to continuously anneal materials for use in applications other than magnetomechanical EAS systems. Such other applications may include EAS systems not of the magnetomechanical type.

Various changes in the foregoing annealing apparatus and modifications in the described practices may be introduced without departing from the invention. The particularly preferred embodiments of the invention are thus intended in an illustrative and not limiting sense. The true spirit and scope of the invention is set forth in the following claims.

What is claimed is:

1. A method of forming a magnetostrictive element for use in a magnetomechanical electronic article (surveillance marker comprising the steps of:

providing a continuous ribbon of an amorphous metal alloy;

transporting the continuous amorphous alloy ribbon through an annealing region in which heat and a saturating magnetic field are applied to anneal the ribbon;

during said transporting step, imparting a curved shape to the continuous amorphous alloy ribbon; and cutting the annealed ribbon into discrete ribbons each having a uniform fixed length.

2. A method according to claim 1, wherein said transporting step includes feeding the continuous ribbon from a supply reel located on one side of the annealing region while taking up the continuous ribbon on a take-up reel located on an opposite side of the annealing region from the supply reel.

3. A method according to claim 1, wherein said saturating magnetic field is applied transversely to a longitudinal axis of the continuous ribbon.

4. A method according to claim 1, wherein the continuous ribbon comprises an alloy of iron, cobalt, silicon and boron.

5. A method according to claim 4, wherein the continuous ribbon essentially has the composition $(Fe_{0.5}Co_{0.5})_{79}Si_6B_{15}$.

6. A method according to claim 1, wherein the continuous ribbon is heated to at least about 300° in said annealing region.

7. A method according to claim 1, wherein said step of imparting a curved shape to the ribbon includes forming a curvature in the ribbon in a direction transverse to a longitudinal axis of the ribbon.

8. A method according to claim 7, wherein said step of imparting a curved shape to the ribbon includes providing a curling fixture in said annealing region and transporting the ribbon through the curling fixture.

9. A method of forming a magnetostrictive element for use in a magnetomechanical electronic article surveillance marker, comprising the steps of:

providing a continuous ribbon of an amorphous metal alloy;

transporting the continuous amorphous alloy ribbon through an annealing region in which heat and a saturating magnetic field are applied to anneal the ribbon;

during said transporting step, imparting a substantially flat profile to the ribbon; and cutting the annealed ribbon into discrete ribbons each having a uniform fixed length.

10. A method according to claim 9, wherein said step of imparting a substantially flat profile to the ribbon includes providing in said annealing region a fixture having a flat guide surface and transporting the ribbon through the fixture.

* * * * *

UNITED STATES PATENT AND TRADEMARK OFFICE
CERTIFICATE OF CORRECTION

PATENT NO. : 5,676,767

DATED : October 14, 1997

INVENTOR(S) : Liu et al.

It is certified that error appears in the above-identified patent and that said Letters Patent is hereby corrected as shown below:

Col. 8, line 24, after "used" insert -- to produce magnetomechanical active --.

Column 8, line 25, delete "magnetomechanical active elements with greater"

Signed and Sealed this

Fourteenth Day of April, 1998

Attest:

BRUCE LEHMAN

Attesting Officer

Commissioner of Patents and Trademarks